United States Patent [19]

Karasawa et al.

[11] Patent Number: 5,200,961
[45] Date of Patent: Apr. 6, 1993

[54] ERROR DETECTION AND/OR CORRECTION DEVICE

[75] Inventors: Katsumi Karasawa, Tokyo; Motokazu Kashida, Musashino, both of Japan

[73] Assignee: Canon Kabushiki Kaisha, Tokyo, Japan

[21] Appl. No.: 550,439

[22] Filed: Jul. 10, 1990

[30] Foreign Application Priority Data

Jul. 13, 1989 [JP] Japan .................................. 1-181160

[51] Int. Cl.$^5$ .............................................. G06F 11/10
[52] U.S. Cl. ........................... 371/37.1; 371/37.8; 371/38.1; 371/39.1; 371/40.1
[58] Field of Search ............. 371/37.1, 37.8, 38.1, 371/39.1, 40.1

[56] References Cited

U.S. PATENT DOCUMENTS

| | | | |
|---|---|---|---|
| 4,382,300 | 5/1983 | Gupta | 371/37.1 |
| 4,397,022 | 8/1983 | Weng | 371/37.1 |
| 4,680,763 | 7/1987 | Suma | 371/37.1 |
| 4,706,250 | 11/1987 | Patel | 371/38.1 |
| 4,736,376 | 4/1988 | Stiffler | 371/37.1 |
| 4,958,349 | 9/1990 | Tanner | 371/37.1 |

Primary Examiner—Robert W. Beausoliel
Assistant Examiner—Ly V. Hua
Attorney, Agent, or Firm—Fitzpatrick, Cella, Harper & Scinto

[57] ABSTRACT

N symbols of a code word inputted from a transmission line and constituting an error detection and/or correction code are divided into i symbol groups, i coefficient groups are generated by dividing n coefficients of a check matrix into i groups, the n coefficients being used for calculation with each code word, and an error of the code word is detected and/or corrected by using a syndrome obtained by adding the calculation results between the i symbol groups and the i coefficient groups, where i is an integer equal to or larger than 2, and n is an integer equal to or larger than i.

12 Claims, 2 Drawing Sheets

ERROR DETECTION AND/OR CORRECTION DEVICE

BACKGROUND OF THE INVENTION

1. Field of the Invention

The present invention relates to an error detection and/or correction device, and more particularly to a syndrome calculation circuit in a device for detecting and/or correcting a code error using a check matrix.

2. Related Background Art

FIG. 1 is a block diagram showing a general arrangement of a syndrome calculation unit section of a digital signal code error detection and/or correction circuit. A code string is applied via a transmission line to an input terminal 10 and is written in a memory 12 on the code word unit basis. Code words $X_1$ to $X_n$ of n symbols written in the memory 12 are sequentially read and applied to multipliers 14, 16, 18 provided in m calculation circuits $C_0$ to $C_m$ for calculating syndromes $S_0$ to $S_m$. Simultaneously with data reading from the memory 12, n coefficients at respective rows of a check matrix of m rows and n columns for calculating syndromes $S_0$ to $S_m$ are read from ROMs 20, 22, 24 and applied to the corresponding m multipliers 14, 16, 18.

The multipliers 14, 16, 18 multiply the data from the memory 12 by the corresponding coefficients from ROMs 20, 22, 24. The outputs from the multipliers 14, 16, 18 are applied to adders 26, 28, 30 for the cumulative addition by n times for each code word. Specifically, the outputs from the adders 26, 28, 30 are fed back to the addition input terminals of the adders 26, 28, 30 via delay circuits 32, 34, 36 so that the adders 26, 28, 30 cumulatively add together the outputs from each multiplier 14, 16, 18. By cumulatively adding all codes of each code word multiplied by each row of the check matrix, the syndromes $S_0$ to $S_m$ for error correction and/or detection can be obtained and stored in a syndrome memory 38. The syndromes stored in the syndrome memory 38 are used later for the error detection process.

With the conventional technique described above, syndromes for code error and/or detection are obtained through multiplication of the coefficients of n rows of the check matrix by all codes of n code length and through cumulative addition of the multiplication results. This poses a problem of a very long calculation time.

SUMMARY OF THE INVENTION

It is an object of the present invention to solve the above problem.

It is another object of the present invention to provide an error detection and/or correction device capable of high speed processing.

With the above objects in view, according to an embodiment of this invention there is provided an error detection and/or correction device, comprising (a) input means for inputting a code train from a transmission line, said code train including a code word constituting an error detection and/or correction code;

(b) division means for dividing n symbols of each code word inputted from said input means into i symbol groups, where i is an integer equal to or larger than 2, and n is an integer equal to or larger than i;

(c) generation means for generating i coefficient groups by dividing n coefficients of a check matrix into i groups, said n coefficients being used for calculation with said each code word;

(d) i calculation means for the calculation between said i symbol groups and said i coefficient groups;

(e) addition means for adding the outputs from said i calculation means and generating a syndrome; and (f) error detection and/or correction means for detecting and/or correcting an error of said code word by using said syndrome outputted from said addition means.

The above and other objects and advantages of this invention will become more apparent from the detailed description of the embodiment when read with reference to the accompanying drawings.

BRIEF DESCRIPTION OF THE PREFERRED EMBODIMENTS

Figure 1:
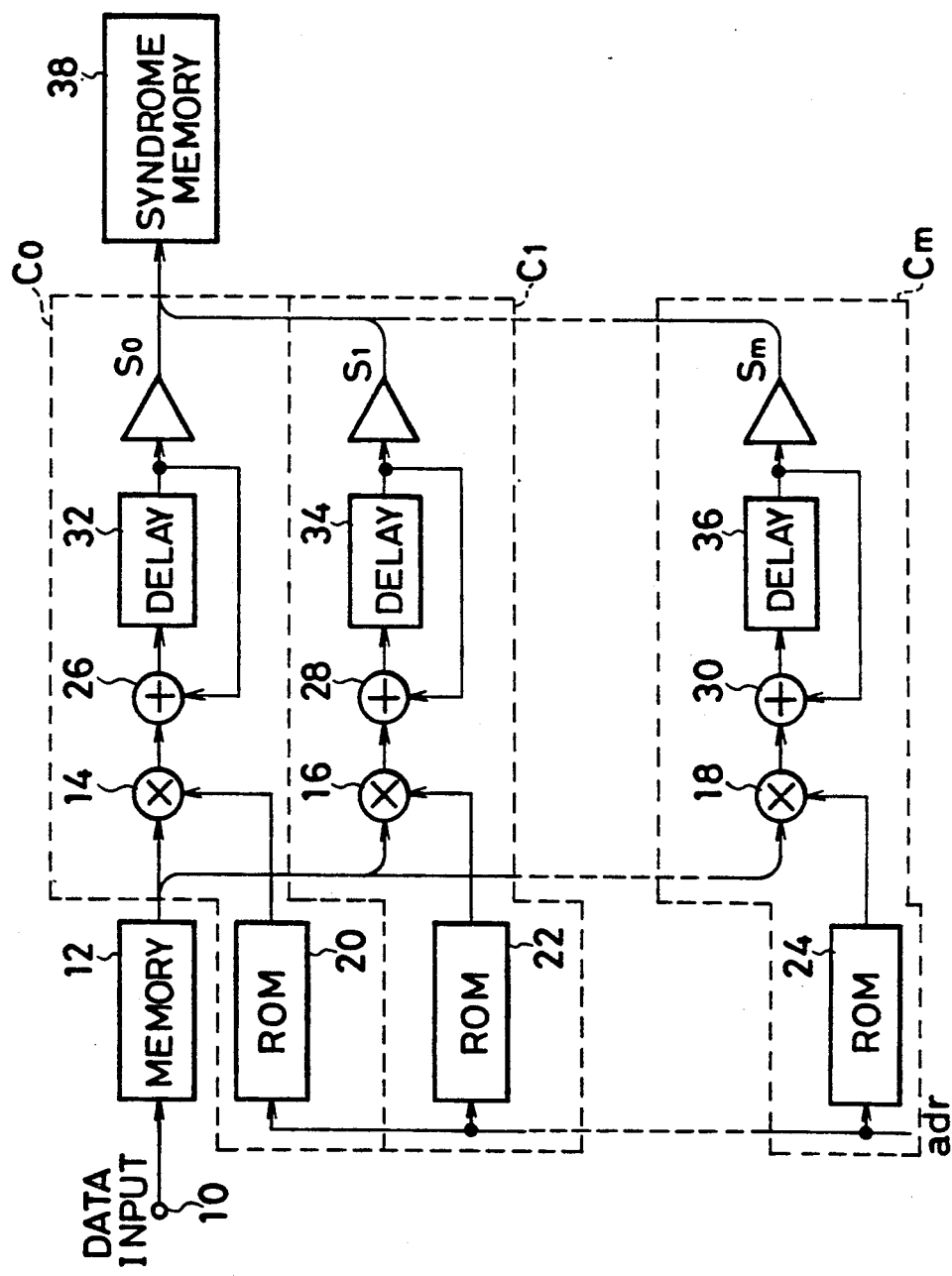
FIG. 1 is a block diagram showing a general arrangement of a syndrome calculation unit section of an error detection and/or correction circuit.

The embodiment of this invention will be described with reference to the accompanying drawings. In the following, a code error detection and/or correction using a Reed Solomon code will be described by way of example.

It is assumed that a Reed Solomon code is composed of a code word $W = [X_1, X_2, X_3, \ldots, X_n]$ where n is the number of symbols each having p bits, and that a check matrix H is represented by using an atom $\alpha$ in the Galois field GF $(2^p)$, for example, by the following equation (1).

$$H = \begin{bmatrix} 1, & 1, & 1, & \ldots, & 1, & 1 \\ \alpha^{n-1}, & \alpha^{n-2}, & \alpha^{n-3}, & \ldots, & \alpha, & 1 \\ \cdot & \cdot & \cdot & & \cdot & \cdot \\ \cdot & \cdot & \cdot & & \cdot & \cdot \\ \alpha^{m(n-1)}, & \alpha^{m(n-2)}, & \alpha^{m(n-3)}, & \ldots, & \alpha^m, & 1 \end{bmatrix} \quad (1)$$

In this case, a code error in a digital signal can be detected and/or corrected by using the syndromes $S_0$ to $S_m$ obtained by the following equation.

$$H \cdot W^T = \begin{bmatrix} 1, & 1, & \ldots, & 1, & 1 \\ \alpha^{n-1}, & \alpha^{n-2}, & \ldots, & \alpha, & 1 \\ \cdot & \cdot & & \cdot & \cdot \\ \cdot & \cdot & & \cdot & \cdot \\ \alpha^{m(n-1)}, & \alpha^{m(n-2)}, & \ldots, & \alpha^m, & 1 \end{bmatrix} \begin{bmatrix} X_1 \\ X_2 \\ \cdot \\ \cdot \\ X_n \end{bmatrix} = \begin{bmatrix} S_0 \\ S_1 \\ \cdot \\ \cdot \\ S_m \end{bmatrix} \quad (2)$$

The code error calculation equation can be divided, e.g., in two equation.

$$H \cdot W^T = H_1 \cdot W_1^T + H_2 \cdot W_2^T \quad (3)$$

-continued $$H_1 \cdot W_1^T = \begin{bmatrix} 1, & 1, & \ldots, & 1 \\ \alpha^{n-1}, & \alpha^{n-3}, & \ldots, & \alpha \\ \cdot & \cdot & & \cdot \\ \cdot & \cdot & & \cdot \\ \alpha^{m(n-1)}, & \alpha^{m(n-3)}, & \ldots, & \alpha^m \end{bmatrix} \begin{bmatrix} X_1 \\ X_3 \\ \cdot \\ \cdot \\ X_{n-1} \end{bmatrix} = \begin{bmatrix} S_{0a} \\ S_{1a} \\ \cdot \\ \cdot \\ S_{ma} \end{bmatrix} \quad (4)$$

$$H_2 \cdot W_2^T = \begin{bmatrix} 1, & 1, & \ldots, & 1 \\ \alpha^{n-2}, & \alpha^{n-4}, & \ldots, & 1 \\ \cdot & \cdot & & \cdot \\ \cdot & \cdot & & \cdot \\ \alpha^{m(n-1)}, & \alpha^{m(n-2)}, & \ldots, & 1 \end{bmatrix} \begin{bmatrix} X_2 \\ X_4 \\ \cdot \\ \cdot \\ X_n \end{bmatrix} = \begin{bmatrix} S_{0b} \\ S_{1b} \\ \cdot \\ \cdot \\ S_{mb} \end{bmatrix} \quad (5)$$

Therefore, it becomes:

$$[Sm] = [Sm\ a] + [Sm\ b] \quad (6)$$

Figure 2:
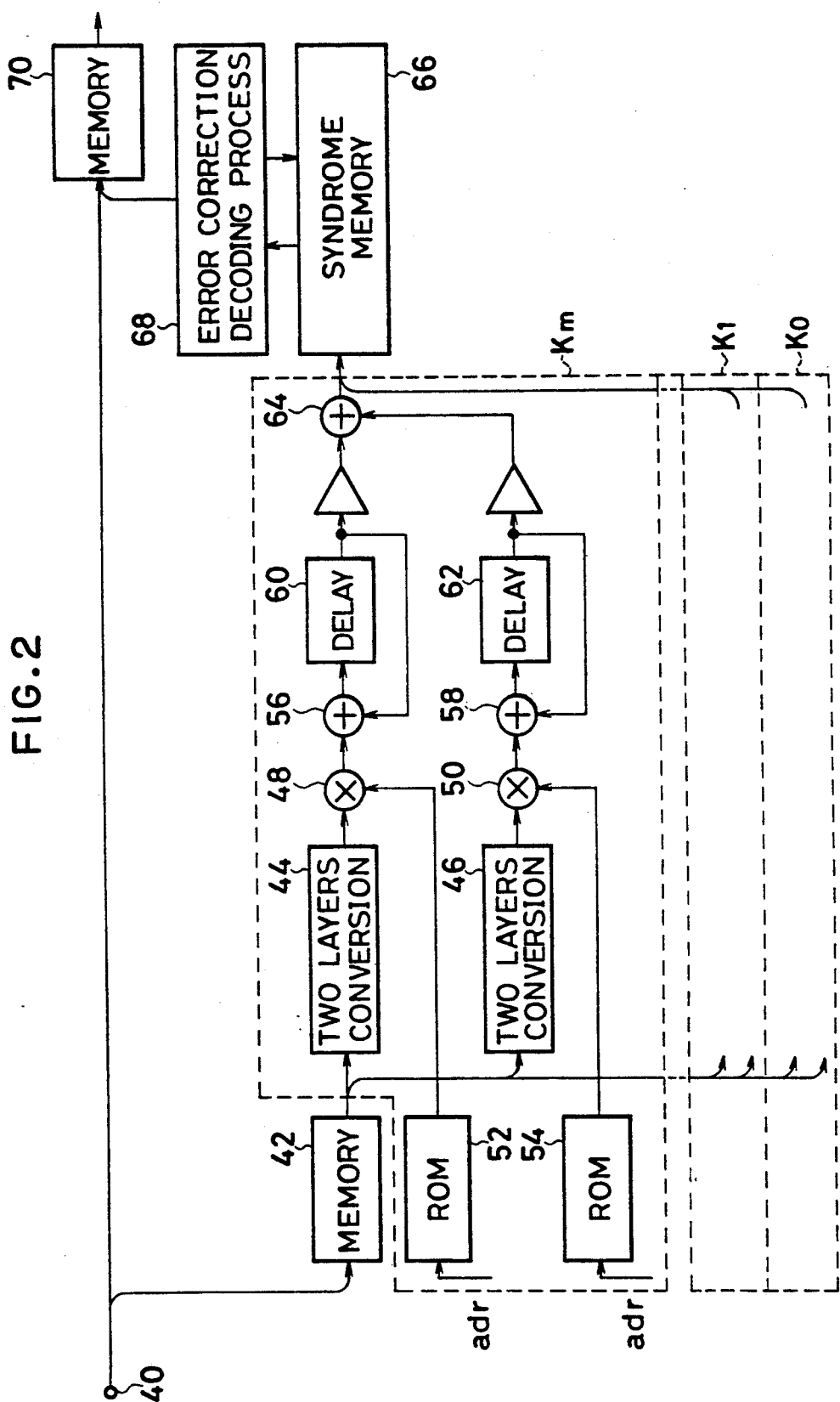
FIG. 2 is a block diagram showing the structure of an error detection and/or correction circuit of an embodiment of the present invention.

FIG. 2 is a block diagram showing the structure of an error correction device according to the embodiment of this invention. Circuits $K_O$ to $K_m$ each calculate one of syndromes $S_O$ to $S_m$ by using the equations (4) and (5). The circuits $K_O$ to $K_{(m-1)}$ are the same as $K_m$, so they are omitted in the drawing. Reference numeral 40 represents an input terminal for receiving a data (code train) from a transmission line, 46 a two layers conversion circuit for subjecting the received data to the two layers conversion to be later described, 48 and 50 multipliers, and 52 and 4 coefficient ROMs for storing coefficients of a check matrix. Reference numerals 56 and 58 represent adders, and 60 and 62 delay circuits. The circuits 56, 58 and 60, 62 constitute a circuit for cumulatively adding together the outputs from the multipliers 48 and 50. Reference numeral 64 represents an adder, 66 a syndrome memory, and 68 an error correction decoding process circuit for executing an error correction process in accordance with syndromes $S_O$ to $S_m$ stored in the syndrome memory 66.

A received code word $W = [X_1, X_2, X_3, \ldots X_n]$ is applied to the input terminal 40 and written in the data memory 42. The data in the data memory 42 is read and divided into two layers by the two layers conversion circuits 44 and 46. Specifically, the two layers conversion circuit 44 outputs half the symbol data of the code word W, i.e., $W_1 = [X_1, X_3, \ldots X_{n-1}]$, and the two layers conversion circuit 46 the remaining symbol data, i.e., $W_2 = [X_2, X_4, \ldots X_n]$. The first symbols $X_z$ and $X_2$ divided into two layers and the corresponding check matrix coefficients $\alpha^{m(n-1)}$ and $\alpha^{m(n-2)}$ from the coefficient ROMs 52 and 54 are supplied to the multipliers 48 and 50. The multiplier 48 multiplies the symbol $X_1$ by the coefficient $\alpha^{m(n-1)}$, and the multiplier 50 multiplies the symbol $X_2$ by the coefficient $\alpha^{m(n-2)}$. The multipliers 48 and 50 then multiply the next symbols $X_3$ and $X_4$ by the coefficients $\alpha^{m(n-3)}$ and $\alpha^{m(n-4)}$, respectively. In the similar manner, the other coefficients are used sequentially for such multiplication. The multiplication results of the multipliers 48 and 50 are cumulatively added together by the adders 56 and 58 and delay circuits 60 and 62. Upon completion of the cumulative addition of the received code word W, the delay circuit 60 outputs $[S_{ma}]$ represented by the equation (4), and the delay circuit 62 $[S_{mb}]$ represented by the equation (5). The adder 64 therefore outputs $[S_m]$ which is stored in the syndrome memory 66.

The check matrix for calculating the syndromes are divided into two as shown in FIG. 2. The number of divisions may be increased, which results in a higher processing speed.

Syndromes $S_O$ to $S_{m-1}$ are also stored in the syndrome memory 66. The error correction decoding processing circuit 68 reads the syndromes $S_O$ to $S_m$ from the syndrome memory 66 at a proper timing, and correctable information codes written in the memory 70 are corrected. Specifically, the position and number of error codes are calculated from the read syndromes, and in accordance with the calculation results the data in the memory 70 are rewritten. This rewriting causes the syndromes in the syndrome memory 66 to change. This change of the syndromes contributes much to the error correction decoding process using a product code.

In the above embodiment, a Reed Solomon code has been described by way of example. The present invention is also applicable to other error detection and/or correction codes whose syndromes are calculated by using a check matrix.

As readily understood from the foregoing description of this invention, syndromes for error code detection can be calculated at high speed so that a code error correction and/or detection can be executed at high speed.

What is claimed is:

1. An error detection and/or correction device, comprising:
   (a) input means for inputting a code train from a transmission line, the code train including a code word constituting an error detection and/or correction code;
   (b) division means for dividing n symbols which belong to each code word input from said input means into i symbol groups, each of the i symbol groups consisting of (n/i) symbols, each of the symbols consisting of j bits, where i, j and (n/i) are integers equal to or larger than 2;
   (c) generation means for generating i coefficient groups by dividing n coefficients of a check matrix into i coefficient groups, each of the i coefficient groups consisting of (n/i) coefficients;
   (d) i calculation means for performing a calculation between the i symbol groups and the i coefficient groups, each of said i calculation means producing an output value corresponding to a sum of values resulting from multiplication of (n/i) symbols by (n/i) coefficients;
   (e) addition means for adding the output values from said i calculation means and generating one syndrome; and
   (f) error detection and/or correction means for detecting and/or correcting an error of the code word by using the syndrome output from said addition means.

2. A device according to claim 1, wherein said division means supplies in parallel i symbols which belong to the i symbol groups, respectively, to said calculation means, and said generation means supplies in parallel i coefficients which belong to the i coefficient groups, respectively, to said calculation means.

3. A device according to claim 1, wherein said division means includes a memory capable of storing one code word, and i extraction circuits for extracting every i-th n symbols stored in said memory.

4. A device according to claim 1, wherein said error detection an/for correction means includes a code memory into which a code train from said input means are written, said code memory having a capacity of storing one or more code words.

5. A device according to claim 4, wherein said error detection ad/or correction means includes error correction means for rewriting a code stored in said code memory by using the syndrome output from said addition means.

6. A device according to claim 5, wherein said error detection an/for correction means includes a syndrome memory for storing the syndrome output from said addition means, and said error correction means rewrites a code sorted in said code memory by using the syndrome stored in said syndrome memory.

7. A device according to claim 6, wherein said error correction mans rewrites the syndrome stored in said syndrome memory in accordance with the rewritten code in said code memory.

8. An error detection an/for correction device, comprising;
   (a) input means of inputting a code train from a transmission line, the code train including a code word constituting an error detection and or correction code;
   (b) division means for dividing n symbols which belong to each code word input from said input means into i symbol groups, each of the is symbol groups consisting of (n/i) symbols, each of the symbols consisting of j bits, where i, j and (n/i) are integers equal to or larger than 2;
   (c) generation means for generating (m×i) coefficient groups by dividing n coefficients of each row of a check matrix of m rows and n columns into i coefficient groups, each of the (m×i) coefficient groups consisting of (n/i) coefficients, where m is an integer equal to or larger than 2;
   (d) (m×i) calculation means for performing parallel calculations between the i symbol groups for the m rows of the (m×i) coefficient groups and the i coefficient groups, each of said (m×i) calculation means producing an output value corresponding to a sum of values resulting from multiplication of (n/i) symbols by (n/i) coefficients;
   (e) m addition means for adding the output values from said (m×i) calculation means for the m rows and generating m syndromes; and
   (f) error detection an/for correction means for detecting and/or correcting an error of the code word by using the m syndromes output from said addition means.

9. A syndrome computing circuit, comprising:
   (a) division means for dividing n symbols which belong to a code word constituting an error detection and/or correction code into i symbol groups, each of the i symbol groups consisting of (n/i) symbols, each of symbols consisting of j bits, where i, j and (n/i) are integers equal to or larger than 2;
   (b) generation means for generating i coefficient groups by dividing n coefficients of a check matrix into i coefficient groups, each of said i coefficient groups consisting of (n/i) coefficients;
   (c) i calculation means for performing a calculation between the i symbol groups and the i coefficient groups, each of said i calculation means producing an output value corresponding to a sum of values resulting from multiplication of (n/i) symbols and (n/i) coefficients; and
   (d) addition means for adding the output values from said i calculation means and generating one syndrome.

10. A circuit according to claim 9, wherein said division means supplies in parallel i symbols which belong to the i symbol groups, respectively, to said calculation means, and said generation means supplies in parallel i coefficients which belong to the i coefficient groups, respectively, to said calculation means.

11. A circuit according to claim 9, wherein said division means includes a memory capable of storing one code work and i extraction circuits for extracting every i-th n symbols stored in said memory.

12. A syndrome computing circuit, comprising:
   (a) division means for dividing n symbols which belong to a code word constituting an error detection an/for correction code into i symbol groups, each of the i symbol groups consisting of (n/i) symbols, each of the symbols consisting of j bits, where i, j and (n/i) are integers equal to or larger than 2;
   (b) generation means for generating (m×i) coefficient groups by dividing n coefficients of each row of a check matrix of m rows and n columns into i coefficient groups, each of the (m×i) coefficient groups consisting of (n/i) coefficients, where m is an integer equal to or larger than 2;
   (c) (m×i) calculation means for performing parallel calculations between the i symbol groups for the m rows of the (m×i) coefficient groups and the i coefficient groups, each of said (m×i) calculation means producing an output value corresponding to a sum of values resulting from multiplication of (n/i) symbols by (n/i) coefficients; and
   (d) m addition means for adding the output values from said (m×i) calculation means for the m rows and generating m syndromes.

* * * * *

UNITED STATES PATENT AND TRADEMARK OFFICE
CERTIFICATE OF CORRECTION

PATENT NO. : 5,200,961

DATED : April 6, 1993

INVENTOR(S) : KATSUMI KARASAWA, ET AL.

It is certified that error appears in the above-identified patent and that said Letters Patent is hereby corrected as shown below:

COLUMN 2

Line 65, "equation." should read --equations.--.

COLUMN 4

Line 3, "are" should read --is--.

COLUMN 5

Line 4, "an/for" should read --and/or--.
Line 6, "are" should read --is--.
Line 9, "ad/or" should read --and/or--.
Line 14, "an/for" should read --and/or--.
Line 20, "mans" should read --means--.
Line 23, "an/for" should read --and/or--.
Line 31, "is" should read --i--.
Line 51, "an/for" should read --and/or--.

UNITED STATES PATENT AND TRADEMARK OFFICE
CERTIFICATE OF CORRECTION

PATENT NO. : 5,200,961
DATED : April 6, 1993
INVENTOR(S) : KATSUMI KARASAWA, ET AL.

It is certified that error appears in the above-identified patent and that said Letters Patent is hereby corrected as shown below:

COLUMN 6

Line 34, "an/for" should read --and/or--.

Signed and Sealed this

Seventeenth Day of May, 1994

Attest:

BRUCE LEHMAN

Attesting Officer   Commissioner of Patents and Trademarks